(12) United States Patent
Wang et al.

(10) Patent No.: US 11,889,707 B2
(45) Date of Patent: Jan. 30, 2024

(54) ORGANIC LIGHT-EMITTING DIODE DISPLAY SUBSTRATE AND MANUFACTURING METHOD THEREOF, AND DISPLAY PANEL

(71) Applicant: BOE TECHNOLOGY GROUP CO., LTD., Beijing (CN)

(72) Inventors: Guoying Wang, Beijing (CN); Zhen Song, Beijing (CN); Yicheng Lin, Beijing (CN); Xing Zhang, Beijing (CN); Pan Xu, Beijing (CN); Ling Wang, Beijing (CN); Ying Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 491 days.

(21) Appl. No.: 17/276,746

(22) PCT Filed: Jun. 5, 2020

(86) PCT No.: PCT/CN2020/094533
§ 371 (c)(1),
(2) Date: Mar. 16, 2021

(87) PCT Pub. No.: WO2020/248901
PCT Pub. Date: Dec. 17, 2020

(65) Prior Publication Data
US 2022/0045146 A1 Feb. 10, 2022

(30) Foreign Application Priority Data
Jun. 13, 2019 (CN) .............................. 201910512473

(51) Int. Cl.
H10K 59/124 (2023.01)
H10K 59/122 (2023.01)
(Continued)

(52) U.S. Cl.
CPC ......... *H10K 59/122* (2023.02); *H10K 59/121* (2023.02); *H10K 59/124* (2023.02); *H10K 71/00* (2023.02); *H10K 59/1201* (2023.02)

(58) Field of Classification Search
CPC .. H10K 59/122; H10K 59/121; H10K 59/124; H10K 71/00; H10K 59/1201; H10K 50/11; H10K 71/135; H10K 59/12
See application file for complete search history.

(56) References Cited

U.S. PATENT DOCUMENTS

2008/0067932 A1 3/2008 Baek et al.
2013/0099221 A1 4/2013 Kawamura et al.

FOREIGN PATENT DOCUMENTS

CN 106340531 A 1/2017
CN 107331690 A 11/2017
(Continued)

OTHER PUBLICATIONS

First Office Action dated Aug. 28, 2020 for application No. CN201910512473.2 with English translation attached.

*Primary Examiner* — Elias Ullah
(74) *Attorney, Agent, or Firm* — Nath, Goldberg & Meyer; Joshua B. Goldberg

(57) ABSTRACT

An organic light-emitting diode (OLED) display substrate, a manufacturing method thereof and a display panel are provided. The OLED display substrate has pixel regions and includes a base substrate and a pixel defining layer disposed on the base substrate; in regions of the pixel defining layer corresponding to the pixel regions, accommodation parts penetrating the pixel defining layer are disposed, and the pixel defining layer is further provided with guide parts disposed corresponding to the accommodation parts, the guide parts are located on a periphery of the corresponding accommodation parts and formed by recessed areas which are formed on a side of the pixel defining layer away from (Continued)

the base substrate, the recessed areas do not penetrate the pixel defining layer, and an orthographic projection of the guide part on the base substrate is directly coupled to an orthographic projection of the corresponding accommodation part on the base substrate.

10 Claims, 2 Drawing Sheets

(51) Int. Cl.
*H10K 59/121* (2023.01)
*H10K 71/00* (2023.01)
*H10K 59/12* (2023.01)

(56) References Cited

FOREIGN PATENT DOCUMENTS

| | | |
|---|---|---|
| CN | 107819017 A | 3/2018 |
| CN | 108538892 A | 9/2018 |
| CN | 110224010 A | 9/2019 |

ORGANIC LIGHT-EMITTING DIODE DISPLAY SUBSTRATE AND MANUFACTURING METHOD THEREOF, AND DISPLAY PANEL

CROSS REFERENCE TO RELATED APPLICATION

This is a National Phase Application filed under 35 U.S.C. 371 as a national stage of PCT/CN2020/094533, filed Jun. 5, 2020, an application claiming the benefit of Chinese Application No. 201910512473.2, filed Jun. 13, 2019, the content of each of which is hereby incorporated by reference in its entirety.

TECHNICAL FIELD

The present disclosure belongs to the field of display technology, and particularly relates to an organic light-emitting diode (OLED) display substrate, a manufacturing method of an organic light-emitting diode display substrate and a display panel.

BACKGROUND

OLED display panels are popular due to their characteristics such as being light and thin, being energy-saving, and having a wide viewing angle, a wide color gamut, and a high contrast.

SUMMARY

An embodiment of the present disclosure provides an OLED display substrate having a plurality of pixel regions, which includes a base substrate, and a pixel defining layer disposed on the base substrate; and in regions of the pixel defining layer, which correspond to the pixel regions, there are disposed accommodation parts which penetrate the pixel defining layer in a direction perpendicular to the base substrate, and the pixel defining layer is further provided with guide parts disposed corresponding to the accommodation parts;

the guide parts are located on a periphery of the corresponding accommodation parts and are formed by recessed areas which are formed at some positions on a side of the pixel defining layer away from the base substrate, the recessed areas do not penetrate the pixel defining layer in the direction perpendicular to the base substrate, and an orthographic projection of the guide part on the base substrate is directly coupled to an orthographic projection of the corresponding accommodation part on the base substrate.

In some implementations, the OLED display substrate further includes:

a first electrode located on a side of the pixel defining layer proximal to the base substrate, a part of the first electrode being exposed through the guide part;

a thin film transistor disposed on a side of a layer, where the first electrode is located, proximal to the base substrate; and an insulating layer that is disposed between the thin film transistor and the layer where the first electrode is located and is provided therein with a via, through which the first electrode is coupled to a drain electrode of the thin film transistor.

In some implementations, the orthographic projection of the guide part on the base substrate at least partially overlaps an orthographic projection of the via on the base substrate.

In some implementations, the orthographic projection of the guide part on the base substrate covers the orthographic projection of the via on the base substrate.

In some implementations, a depth of the recessed area which forms the guide part ranges from 200 nm to 300 nm.

In some implementations, the OLED display substrate further includes a light-emitting layer at least located in the accommodation part.

An embodiment of the present disclosure further provides a manufacturing method of an OLED display substrate which has a plurality of pixel regions, and the manufacturing method includes:

forming a pixel defining layer on a base substrate by a patterning process, and forming accommodation parts and guide parts in regions of the pixel defining layer corresponding to the pixel regions, the accommodation parts penetrate the pixel defining layer in a direction perpendicular to the base substrate, the guide parts are located on a periphery of the corresponding accommodation parts and are formed by recessed areas which are formed at some positions on a side of the pixel defining layer away from the base substrate, the recessed areas do not penetrate the pixel defining layer in the direction perpendicular to the base substrate, and an orthographic projection of the guide part on the base substrate is directly coupled to an orthographic projection of the corresponding accommodation part on the base substrate.

In some implementations, the accommodation part and the guide part are formed by a single patterning process.

In some implementations, the manufacturing method further includes:

forming a light-emitting layer of an OLED in the accommodation part.

An embodiment of the present disclosure further provides a display panel, including the above OLED display substrate.

DETAILED DESCRIPTION

Figure 1:
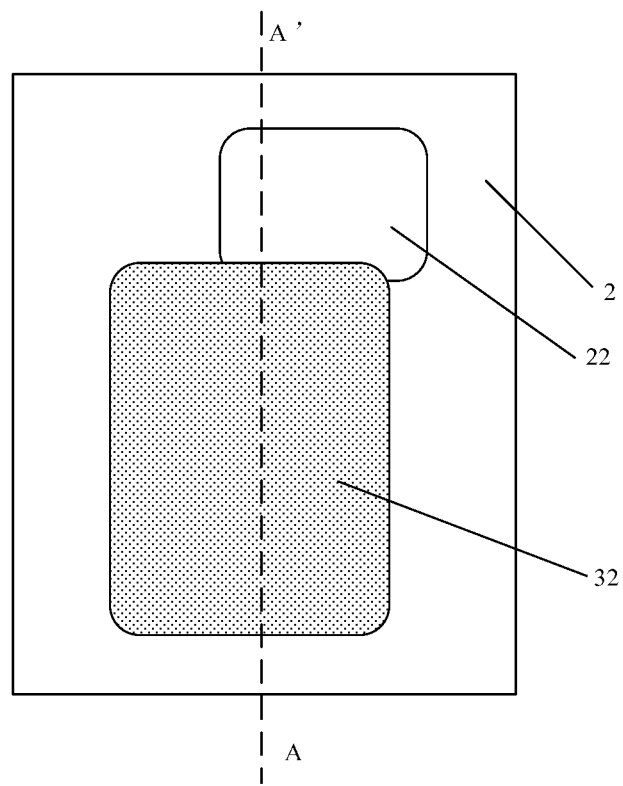
FIG. 1 is a schematic planar diagram of a structure of an OLED display substrate according to an embodiment of the present disclosure.

In order to enable those skilled in the art to better understand the technical solutions of the present disclosure, the technical solutions of the present disclosure are further described in detail below with reference to the accompanying drawings and specific implementations.

In the related art, in order to meet the requirement for the luminance of an OLED display panel, an accommodation part of a pixel defining layer is generally filled with thick ink to form a thicker light-emitting layer in a manufacturing process of an OLED. However, since the intervals between adjacent sub-pixels (especially between adjacent sub-pixels in the same pixel unit) are relatively small in a high-resolution OLED display panel, the overflow of the ink, which easily occurs when the accommodation part is filled with a relatively large amount of the ink, can affect a display effect of the OLED display panel.

An embodiment of the present disclosure provides an OLED display substrate having a plurality of pixel regions, each pixel region includes a display region and a non-display region located on a periphery of the display region, the display region is provided with an OLED, and the non-display region is provided with signal lines and other elements.

The specific structure of the OLED display substrate in the embodiment is described below with reference to FIGS. 1 and 2.

Specifically, the OLED display substrate in the embodiment includes a base substrate 1, and a pixel defining layer 2 disposed on the base substrate 1, and in regions of the pixel defining layer 2, which correspond to the pixel regions, there are disposed accommodation parts 21, which penetrate the pixel defining layer 2 in a thickness direction of the pixel defining layer 2 (that is, a direction perpendicular to the base substrate 1).

An OLED in the OLED display substrate includes a first electrode 31, a light-emitting layer 32, and a second electrode, which are sequentially disposed on the base substrate 1. The first electrode 31 is located under the pixel defining layer 2 (on a side of the pixel defining layer 2 proximal to the base substrate 1), a part of the first electrode 31 is exposed through the accommodation part 21, the light-emitting layer 32 is located in the accommodation part 21, and the second electrode is located above the light-emitting layer 32, that is, the light-emitting layer 32 is sandwiched between the first electrode 31 and the second electrode. The first electrode 31 and the second electrode are a cathode and an anode of the OLED, respectively. In the embodiment, the detailed description is given by taking the first electrode 31 as the anode and the second electrode as the cathode.

Figure 2:
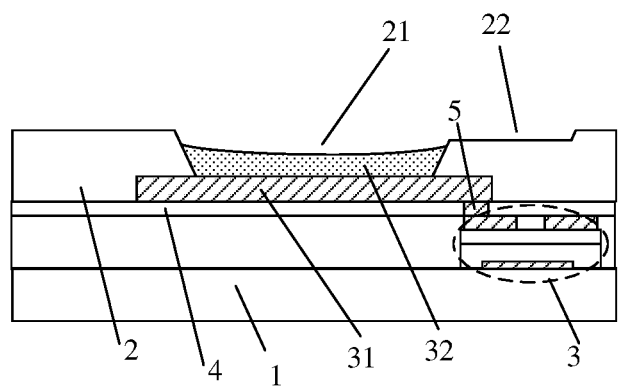
FIG. 2 is a schematic sectional diagram of a structure of the OLED display substrate shown in FIG. 1 taken along line AA'.
Figure 3:
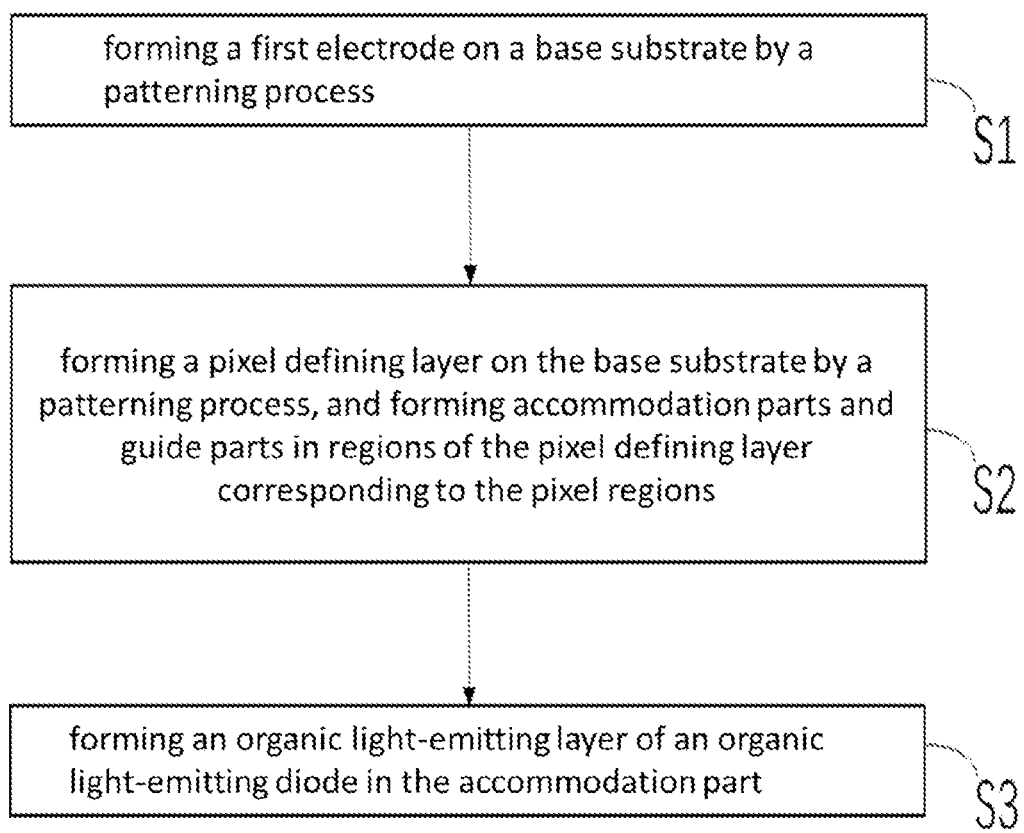
FIG. 3 is a flowchart illustrating a manufacturing method of an OLED display substrate according to an embodiment of the present disclosure.

Specifically, the pixel defining layer 2 in the embodiment is further provided with guide parts 22 disposed corresponding to the accommodation parts 21; the guide parts 22 are formed on a side of the pixel defining layer 2 away from the base substrate 1, and are located on a periphery of the corresponding accommodation parts 21; and an orthographic projection of the guide part 22 on the base substrate 1 is directly coupled to an orthographic projection of the corresponding accommodation part 21 on the base substrate 1, as shown in FIG. 1.

In the embodiment, each accommodation part 21 corresponds to at least one guide part 22 located on the periphery of the corresponding accommodation part 21; and in comparison with the accommodation parts 21 which penetrate the pixel defining layer 2, the guide parts 22 in the embodiment are formed by recessed areas which are formed at some positions on the side of the pixel defining layer 2 away from the base substrate 1, and the recessed areas do not penetrate the pixel defining layer 2 in the thickness direction of the pixel defining layer 2. Moreover, the guide part 22 communicates with the corresponding accommodation part 21, and the orthographic projections of the guide part 22 and the accommodation part 21 on the base substrate 1 are directly coupled to each other to form an integral pattern. That is, in the pixel defining layer 2 located in the same pixel region, the accommodation part 21 and the guide part 22 together constitute a space capable of accommodating the light-emitting layer 32, and a height of a part of a sidewall of the accommodation part 21 (a part coupled to the guide part 22) is lower than that of other parts of the pixel defining layer 2, as shown in FIG. 2.

It should be understood that the ink used as the luminescent material (such as the ink used as the organic luminescent material) is generally printed into the accommodation part 21 by means of inkjet printing or other means to form the light-emitting layer 32 in the related art. In the embodiment, with the guide parts 22 disposed in the pixel defining layer 2, the extra ink can naturally discharge into the guide parts 22 corresponding to the accommodation parts 21 when the ink used as the luminescent material is excessive during the formation of the light-emitting layers 32 in the accommodation parts 21, so that color mixing caused by the overflow of the extra ink into the accommodation parts 21 of the adjacent pixels can be avoided, thereby improving a production yield of OLED display substrates.

It should be noted that the guide parts 22 in adjacent pixel regions do not communicate with one another in the OLED display substrate according to the embodiment, so as to prevent the extra ink from flowing into the adjacent pixel regions through the guide parts 22.

In the embodiment, a depth of the recessed area which forms the guide part 22 may range from 200 nm to 300 nm. That is, the height of the part of the sidewall of the accommodation part 21 coupled to the guide part 22 is 200 nm to 300 nm lower than that of the other parts of the pixel defining layer 2.

In the embodiment, the OLED display substrate may further include a thin film transistor 3, which may be disposed on a side of the layer, where the first electrode 31 is located, proximal to the base substrate 1; and an insulating layer 4 disposed between the thin film transistor 3 and the layer where the first electrode 31 is located. A via 5 may be disposed in the insulating layer 4 in the non-display region, and the first electrode 31 may be coupled to a drain electrode of the thin film transistor 3 through the via 5, as shown in FIG. 2. It should be understood that the non-display region is further provided with signal lines, through which a control signal is input to the thin film transistor to control the OLED to emit light.

The thin film transistor 3 may include a gate electrode, a source electrode, a drain electrode, an active layer, and other structures. A material of the active layer may include various oxides, silicon materials, and organic materials, such as a-IGZO (Indium Gallium Zinc Oxide), ZnON, IZTO (Indium Zinc Tin Oxide), a-Si, p-Si, hexathiophene, and polythiophene. The thin film transistor may be in various types, such as a top gate type, a conventional etch stop type, and a back channel etch, which is not limited in the embodiment.

In some implementations, the orthographic projection of the guide part 22 on the base substrate 1 at least partially overlaps an orthographic projection of the via 5 on the base substrate 1. For example, the guide part 22 may be disposed above the via 5 (that is, on a side away from the base substrate 1). It should be understood that the region where the guide parts 22 are located cannot perform a display function because the guide parts 22 are formed by the recessed areas which are formed at some positions on the side of the pixel defining layer 2 away from the base substrate 1 and do not penetrate the pixel defining layer 2 in the thickness direction of the pixel defining layer 2. The via 5 is also located in the non-display region, but the guide part 22 and the via 5 are not in the same layer. In the embodiment, with such arrangement of the guide part 22 and the via 5, the area of the OLED display substrate, which is occupied by the guide part 22 and the via 5, can be relatively reduced, that is, the non-display region can be reduced, so as to enable the OLED display substrate to have a higher resolution as much as possible, and improve the display effect of the OLED display substrate.

In some implementations, the orthographic projection of the guide part 22 on the base substrate 1 covers the orthographic projection of the via 5 on the base substrate 1. That is, under the condition that the position of the guide part 2 relative to the base substrate 1 is kept consistent with the position of the via 5 relative to the base substrate 1 as much as possible, the area of the guide part 22 is made as large as possible, so as to increase the resolution of the OLED display substrate to the maximum extent while avoiding cross color of adjacent pixel regions.

It should be noted that the conductive structures such as the electrodes and the signal lines in the embodiment may be made of commonly used metal materials, such as Ag, Cu, Al, and Mo, or made of multi-layer metal materials, such as MoNb/Cu/MoNb, or made of alloy materials of the above metals, such as AlNd and MoNb; and those conductive structures may adopt a stacked structure made of metals and transparent conductive oxides (such as ITO, and AZO), such as ITO/Ag/ITO. Moreover, the insulating layer 4 in the embodiment may include an inorganic insulating layer and/or an organic insulating layer. A material of the inorganic insulating layer includes, but is not limited to, a conventional dielectric material, such as SiOx, SiNx, and SiON, or various materials having high dielectric constants (High k), such as AlOx, HfOx, and TaOx; and a material of the organic insulating layer includes, but is not limited to, a material having a planarization function, such as a polysiloxane material, an acrylic material, and a polyimide material.

An embodiment of the present disclosure further provides a manufacturing method of an OLED display substrate, which can be used to manufacture the OLED display substrate provided by the above embodiment. The manufacturing method may include the following steps S1 to S3.

At the step S1, forming a first electrode on a base substrate by a patterning process.

Specifically, the first electrode may be formed on the base substrate by the steps of film formation, exposure, development, etching, etc. in the embodiment.

At the step S2, forming a pixel defining layer on the base substrate by a patterning process, and forming accommodation parts and guide parts in regions of the pixel defining layer corresponding to the pixel regions.

The accommodation parts penetrate the pixel defining layer in a thickness direction of the pixel defining layer; the guide parts are formed on a side of the pixel defining layer away from the base substrate, and are located on a periphery of the corresponding accommodation parts; and an orthographic projection of the guide part on the base substrate is directly coupled to an orthographic projection of the corresponding accommodation part on the base substrate.

In the embodiment, the guide parts may be formed by etching the pixel defining layer, or may be formed in such a way that recesses are formed in another layer structure below the pixel defining layer and the pixel defining layer naturally sinks in the recessed areas to form the guide parts.

In some implementations, the accommodation parts and the guide parts may be formed by a single patterning process. Specifically, in this step, all the materials corresponding to the accommodation parts and part of the materials corresponding to the guide parts are removed with a Half Tone Mask (HTM) or a Gray Tone Mask (GTM) by the single patterning process (film formation, exposure, development, wet etching or dry etching) during the formation of the pixel defining layer, so as to form the accommodation parts and the guide parts directly communicated to the accommodation parts.

At the step S3, forming a light-emitting layer of an OLED in the accommodation part.

Specifically, in this step, the accommodation part may be filled with the ink used as the luminescent material (such as the ink used as the organic luminescent material) by an inkjet printing process, and then a drying process is performed to obtain the light-emitting layer.

It should be understood that, since the accommodation parts directly communicate with the guide parts in the OLED display substrate in the embodiment, the extra ink can discharge into the guide parts 22 corresponding to the accommodation parts 21 when the ink used as the luminescent material is excessive during the printing process of the ink used as the luminescent material, so that the color mixing caused by the overflow of the extra ink into the accommodation parts 21 of the adjacent pixels can be avoided, thereby improving the production yield of OLED display substrates.

An embodiment of the present disclosure further provides a display panel, including the OLED display substrate provided by the above embodiment.

The display panel can be used in any product or component with a display function, such as electronic paper, a mobile phone, a tablet computer, a television, a monitor, a notebook computer, a digital photo frame, and a navigator. The display panel in the embodiment has a good display effect.

It should be understood that the above embodiments are merely exemplary embodiments employed to illustrate the principle of the present disclosure, and the present disclosure is not limited thereto. Those of ordinary skill in the art can make various changes and modifications without departing from the spirit and essence of the present disclosure, and those changes and modifications should be considered to fall within the protection scope of the present disclosure.

What is claimed is:

1. An organic light-emitting diode display substrate having a plurality of pixel regions, comprising a base substrate, and a pixel defining layer disposed on the base substrate; wherein, in regions of the pixel defining layer, which correspond to the pixel regions, there are disposed accommodation parts which penetrate the pixel defining layer in a direction perpendicular to the base substrate, the pixel defining layer is further provided with guide parts disposed corresponding to the accommodation parts, the guide parts are located on a periphery of the corresponding accommodation parts and are formed by recessed areas which are formed at positions on a side of the pixel defining layer away from the base substrate, the recessed areas do not penetrate the pixel defining layer in the direction perpendicular to the base substrate, and an orthographic projection of the guide part on the base substrate is directly coupled to an orthographic projection of the corresponding accommodation part on the base substrate.

2. The organic light-emitting diode display substrate of claim 1, further comprising:

a first electrode located on a side of the pixel defining layer proximal to the base substrate, a part of the first electrode being exposed through the guide part;

a thin film transistor disposed on a side of a layer, where the first electrode is located, proximal to the base substrate; and an insulating layer that is disposed between the thin film transistor and the layer where the first electrode is located and is provided therein with a via, through which the first electrode is coupled to a drain electrode of the thin film transistor.

3. The organic light-emitting diode display substrate of claim 2, wherein the orthographic projection of the guide part on the base substrate at least partially overlaps an orthographic projection of the via on the base substrate.

4. The organic light-emitting diode display substrate of claim 3, wherein the orthographic projection of the guide part on the base substrate covers the orthographic projection of the via on the base substrate.

5. The organic light-emitting diode display substrate of claim 1, wherein a depth of the recessed area which forms the guide part ranges from 200 nm to 300 nm.

6. The organic light-emitting diode display substrate of claim 1, further comprising a light-emitting layer at least located in the accommodation part.

7. A display panel, comprising the organic light-emitting diode display substrate of claim 1.

8. A manufacturing method of an organic light-emitting diode display substrate which has a plurality of pixel regions, comprising:
  forming a pixel defining layer on a base substrate by a patterning process, and forming accommodation parts and guide parts in regions of the pixel defining layer corresponding to the pixel regions, wherein the accommodation parts penetrate the pixel defining layer, the guide parts are located on a periphery of corresponding accommodation parts and are formed by recessed areas which are formed at positions on a side of the pixel defining layer away from the base substrate, the recessed areas do not penetrate the pixel defining layer in a direction perpendicular to the base substrate, and
  an orthographic projection of the guide part on the base substrate is directly coupled to an orthographic projection of the corresponding accommodation part on the base substrate.

9. The manufacturing method of claim 8, wherein the accommodation part and the guide part are formed by a single patterning process.

10. The manufacturing method of claim 9, further comprising:
  forming a light-emitting layer of an organic light-emitting diode in the accommodation part.

\* \* \* \* \*